United States Patent
Uejima

(10) Patent No.: US 9,077,439 B2
(45) Date of Patent: Jul. 7, 2015

(54) HIGH-FREQUENCY MODULE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 209 days.

(21) Appl. No.: 13/782,026

(22) Filed: Mar. 1, 2013

(65) Prior Publication Data

US 2013/0176916 A1    Jul. 11, 2013

Related U.S. Application Data

(63) Continuation of application No. PCT/JP2011/071792, filed on Sep. 26, 2011.

(30) Foreign Application Priority Data

Sep. 29, 2010    (JP) ................................. 2010-218065

(51) Int. Cl.
| | |
|---|---|
| H04B 1/48 | (2006.01) |
| H03H 7/46 | (2006.01) |
| H04B 1/00 | (2006.01) |

(52) U.S. Cl.
CPC ................ *H04B 1/48* (2013.01); *H04B 1/0057* (2013.01); *H03H 7/463* (2013.01)

(58) Field of Classification Search
CPC .......... H04B 1/0057; H04B 1/48; H04B 1/44; H04B 1/005; H03H 9/725; H03H 7/463; H03H 9/0566; H01P 1/213

USPC ................................................... 333/132, 133
See application file for complete search history.

(56) References Cited

U.S. PATENT DOCUMENTS

| | | | |
|---|---|---|---|
| 7,239,217 B2 * | 7/2007 | Satoh et al. .................... | 333/133 |
| 8,390,396 B2 * | 3/2013 | Furutani ........................ | 333/132 |
| 8,558,641 B2 * | 10/2013 | Murase et al. ................. | 333/126 |
| 8,803,632 B2 * | 8/2014 | Takeuchi ....................... | 333/101 |

(Continued)

FOREIGN PATENT DOCUMENTS

| | | |
|---|---|---|
| JP | 2006-246234 A | 9/2006 |
| JP | 2008-10995 A | 1/2008 |

(Continued)

OTHER PUBLICATIONS

Official Communication issued in International Patent Application No. PCT/JP2011/071792, mailed on Nov. 15, 2011.

*Primary Examiner* — Dean Takaoka
*Assistant Examiner* — Alan Wong
(74) *Attorney, Agent, or Firm* — Keating & Bennett, LLP

(57) ABSTRACT

A small high-frequency module has a structure such that a high-power signal is prevented from leaking to a switch device. On the top surface of a multilayer body, a switch device and a duplexer are mounted so as to be spaced apart from each other by a predetermined distance. An inductor and resistors connected to a circuit different from a transmission system circuit are mounted between the switch device and the duplexer. The inductor and the resistors are mounted such that external connection terminals connected to the switch device are on the switch device side and external connection terminals connected to external connection power system port electrodes of the high-frequency module are on the duplexer side.

18 Claims, 7 Drawing Sheets

(56) References Cited

U.S. PATENT DOCUMENTS

| | | | |
|---|---|---|---|
| 9,001,710 B2 * | 4/2015 | Uejima | 370/282 |
| 2004/0071111 A1 | 4/2004 | Satoh et al. | |
| 2007/0229189 A1 * | 10/2007 | Iwata | 333/133 |
| 2009/0093270 A1 | 4/2009 | Block et al. | |

FOREIGN PATENT DOCUMENTS

| | | |
|---|---|---|
| JP | 2009-531882 A | 9/2009 |
| JP | 2010-206502 A | 9/2010 |
| WO | 03/036806 A1 | 5/2003 |
| WO | WO 2010053131 A1 * | 5/2010 |

* cited by examiner

HIGH-FREQUENCY MODULE

BACKGROUND OF THE INVENTION

1. Field of the Invention

The present invention relates to high-frequency modules that transmit and receive a plurality of communication signals using a common antenna.

2. Description of the Related Art

There are various types of high-frequency modules among existing high-frequency modules that transmit and receive a plurality of signals having different frequencies using a common antenna. For example, a high-frequency module disclosed in Japanese Unexamined Patent Application Publication No. 2008-10995, includes a switching IC and a duplexer.

Here, a duplexer is a circuit device that separates a transmission signal and a reception signal that use different frequency bands in a single communication band. For example, a duplexer disclosed in Japanese Unexamined Patent Application Publication No. 2008-10995 is connected between an antenna input/output port (specifically, an antenna input/output port via a switch IC) and a pair of a transmission signal input port and a reception signal output port for a single communication band in a code division multiple access (CDMA) communication system. The duplexer transmits a transmission signal in the single communication band from the transmission signal input port to the antenna input/output port and transmits a reception signal in the single communication band from the antenna input/output port to the reception signal output port.

Currently, reductions in the sizes of high-frequency modules are required in accordance with reductions in the sizes of communication apparatuses. Thus, as disclosed in Japanese Unexamined Patent Application Publication No. 2008-10995, there may be cases in which a duplexer and a switch device need to be mounted so as to be close to each other.

However, since a high-power transmission signal is input to a duplexer, there may be a problem in that a portion of the transmission signal leaks from the duplexer to the switch device. In particular, when a transmission signal leaks to power system terminals for applying a driving voltage and a control voltage to the switch device and is superimposed on the driving voltage or the control voltage, the switch characteristics are degraded, which may lead to the degradation of the various characteristics of the high-frequency module.

SUMMARY OF THE INVENTION

Preferred embodiments of the present invention provide a relatively small high-frequency module in which a high-power transmission signal does not affect a switch circuit.

A high-frequency module according to preferred embodiment of the present invention includes a switch device that connects, through switching, a common terminal to a plurality of individual terminals, a duplexer that separates a transmission signal and a reception signal in a single communication band, and a multilayer body in which the switch device and the duplexer are mounted on a top surface of the multilayer, external connection port electrodes are provided on a bottom surface of the multilayer body, and predetermined electrode patterns of the high-frequency module are provided on internal layers.

A high-frequency module according to a preferred embodiment of the present invention preferably further includes a surface-mount circuit device mounted on the top surface of the multilayer body. In this high-frequency module, the surface-mount circuit device, which is connected at a location different from a transmission path for the transmission signal, is mounted between the switch device and the duplexer.

With this configuration, even when a high-power transmission signal input to the duplexer leaks, the influence of the leaked transmission signal on the switch device is significantly reduced or prevented, since the surface-mount circuit device is disposed between the duplexer and the switch device.

The duplexer preferably has a quadrangular or substantially quadrangular shape when viewed in plan from a stacking direction. In the duplexer, a transmission signal input terminal, a common terminal, and a reception signal output terminal are provided near the sides of the duplexer. The duplexer is mounted such that the side of the duplexer that is different from the sides of the duplexer near which the transmission signal input terminal and the common terminal are provided is arranged on a switch device side.

With this configuration, the transmission signal input terminal and the common terminal through which a transmission signal propagates are spaced apart from the switch device. As a result, leakage of a transmission signal to the switch device is further reduced or prevented.

The duplexer preferably is mounted such that the side near which the transmission signal input terminal is provided is the side farthest from the switch device.

With this configuration, the positional relationship between the transmission signal input terminal of the duplexer and the switch IC is more specific. In the duplexer, the transmission signal input terminal to which a highest-power signal is input is disposed on a side opposite the switch device side. Thus, leakage of a transmission signal to the switch device is further reduced or prevented.

The external connection port electrodes preferably include a transmission signal input electrode to which the transmission signal is input from the outside. The duplexer is mounted such that the transmission signal input terminal and the transmission signal input port electrode are at least partially superposed with each other when the multilayer body is viewed in plan.

With this configuration, the electrode provided on the top surface of the multilayer body on which the transmission signal input terminal of the duplexer is mounted and the transmission signal input port electrode provided on the bottom surface of the multilayer body are approximately at the same location when the multilayer body is viewed in plan. Thus, with typical wiring in the stacking direction, an inner layer transmission system electrode pattern to connect the electrode on which the transmission signal input terminal of the duplexer is mounted to the transmission signal input port electrode can be reduced in length. As a result, undesired electromagnetic coupling and electrostatic coupling between the transmission system electrode pattern and other electrode patterns, such as electrode patterns connected to the switch device, is significantly reduced or prevented. Consequently, leakage of a transmission signal to the switch device is further reduced or prevented.

An electrode on which the transmission signal input terminal is mounted is preferably connected to the transmission signal input port electrode only by a via electrode arranged in the stacking direction of the multilayer body.

With this configuration, the electrode on which the transmission signal input terminal of the duplexer is mounted is connected to the transmission signal input port electrode with the shortest distance in the stacking direction. As a result, undesired electromagnetic coupling and electrostatic coupling between the transmission system electrode pattern and other electrode patterns, such as electrode patterns connected to the switch device, is further reduced or prevented. Consequently, leakage of a transmission signal to the switch device is further reduced or prevented.

The switch device preferably includes a plurality of power supply system terminals to which a driving voltage and a control voltage are applied. The external connection port electrodes include a plurality of power supply system input port electrodes to which the driving voltage and the control voltage are applied. The circuit device, which is mounted between the switch device and the duplexer, is preferably a resistance element or a coil component connected between the plurality of the power supply system terminals and the plurality of the power supply system input port electrodes.

With this configuration, specific examples of the circuit devices mounted between the switch device and the duplexer are illustrated. By using such resistance elements and a coil component, even when a transmission signal leaks, the leaked transmission signal is attenuated by these components such that leakage to the switch device is significantly reduced or prevented.

The resistance element or the coil component is preferably mounted such that an end to be connected to the power supply system input port electrode is on a duplexer side.

With this configuration, a specific manner in which the resistance element or the coil component is mounted is illustrated. In this mounting arrangement, since an end of the resistance element or the coil component connected to the switch device does not face and is not near the duplexer, a transmission signal leaking to the switch device without flowing through the resistance element or the coil electrode is further reduced or prevented.

The circuit device mounted between the switch device and the duplexer is preferably a matching device connected to a transmission path different from a reception signal transmission path including the duplexer.

Another specific example of the circuit device mounted between the switch device and the duplexer is illustrated. By using such a matching device, even when a transmission signal leaks, the leaked transmission signal is attenuated such that leakage to the switch device is significantly reduced or prevented.

In the high-frequency module according to a preferred embodiment of the present invention, preferably, one end of the matching device is connected to the ground, and the matching device is mounted such that the one end is on the duplexer side.

With this configuration, a specific manner in which the matching device is mounted is illustrated. In this mounting manner, since the ground side of the matching device is on the duplexer side, a leaked transmission signal is likely to flow to the ground such that a transmission signal leaking to the switching device is further reduced or prevented.

The duplexer is preferably mounted on a side of the switch device opposite a side of the switch device where the power supply system terminals are arranged.

With this configuration, the power supply system terminals are further spaced apart from the duplexer. Thus, superposition of a leaked transmission signal on the control voltage and the driving voltage is further reduced or prevented.

According to various preferred embodiments of the present invention, leakage of a high-power transmission signal to a switching device is significantly reduced or prevented, and a high-frequency module which is relatively small and has excellent switch characteristics is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A high-frequency module according to a first preferred embodiment of the present invention will be described with reference to the drawings. In the present preferred embodiment, for example, a high-frequency module will be described which performs transmission and reception of a signal (a transmission signal and a reception signal) using a global system for mobile communications (GSM) 850 communication band, a signal using a GSM 900 communication band, a signal (a transmission signal and a reception signal) using a GSM 1800 communication band, a signal (a transmission signal and a reception signal) using a GSM 1900 communication band, and transmission and reception of a signal (a transmission signal and a reception signal) using a communication band of a CDMA communication system. Here, transmitter and receiver circuits for a GSM 850 communication signal, a GSM 900 communication signal, a GSM 1800 communication signal, and a GSM 1900 communication signal may be appropriately omitted. A communication system other than the GSM communication systems is not limited to a CDMA system and may include more than one system.

Hereinafter, a case in which a switch IC is used as an example of a switch circuit will be described. However, a switch device having another structure may alternatively be used.

Figure 1:
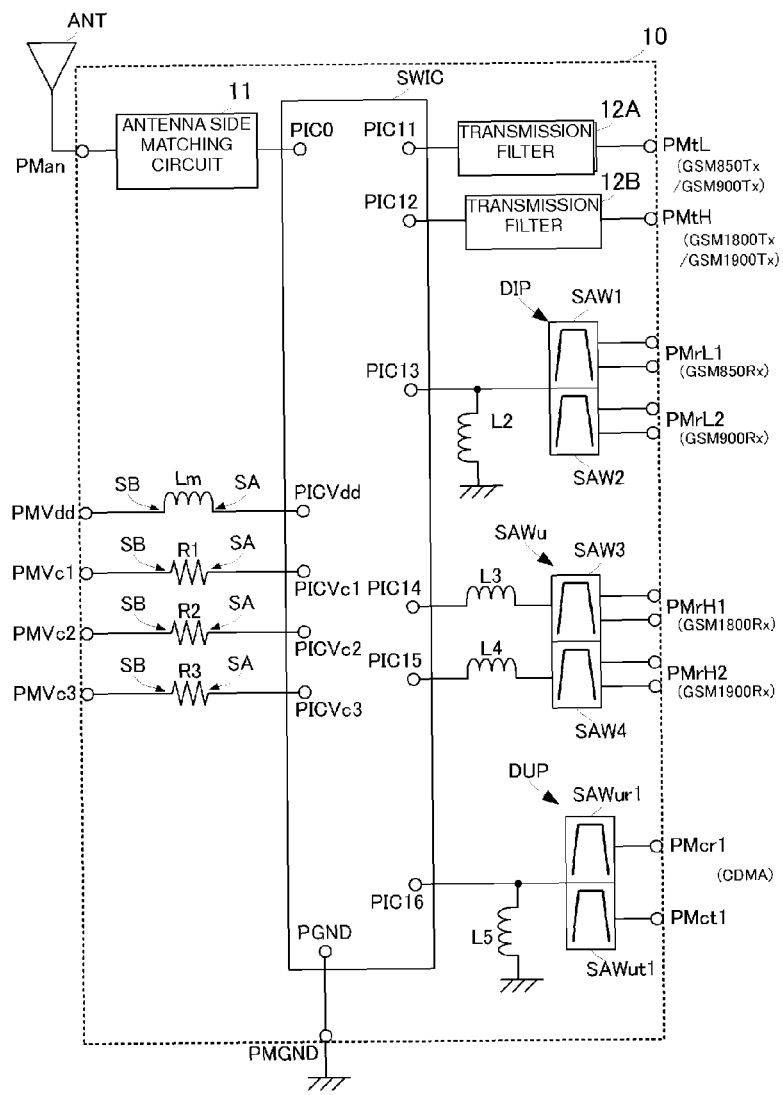
FIG. 1 is a block diagram illustrating the circuit configuration of a high-frequency module according to a first preferred embodiment of the present invention.

First, a circuit configuration of a high-frequency module 10 according to the present preferred embodiment will be described. FIG. 1 is a block diagram illustrating the circuit configuration of the high-frequency module 10 according to the present preferred embodiment.

A switch device SWIC includes a single common terminal PICO and six individual terminals PIC11-PIC16. The switch device SWIC includes a ground terminal PGND to be connected to the ground GND. The ground terminal PGND is connected to an external connection ground port electrode PMGND of the high-frequency module 10. The switch device SWIC, which is a surface-mount circuit device, is mounted on the top surface of a multilayer body.

The switch device SWIC includes a driving voltage application terminal PICVdd, and a plurality of control voltage application terminals PICVc1, PICVc2, and PICVc3. The driving voltage application terminal PICVdd is connected to an external connection power supply system port electrode PMVdd of the high-frequency module 10. The control voltage application terminals PICVc1, PICVc2, and PICVc3 are respectively connected to external connection power system port electrodes PMVc1, PMVc2, and PMVc3 of the high-frequency module 10.

An inductor Lm is connected between the driving voltage application terminal PICVdd of the switch device SWIC and the external connection power supply system port electrode PMVdd of the high-frequency module 10.

A resistor R1 is connected between the control voltage application terminal PICVc1 of the switch device SWIC and the external connection power system port electrode PMVc1 of the high-frequency module 10. A resistor R2 is connected between the control voltage application terminal PICVc2 of the switch device SWIC and the external connection power system port electrode PMVc2 of the high-frequency module 10. A resistor R3 is connected between the control voltage application terminal PICVc3 of the switch device SWIC and the external connection power system port electrode PMVc3 of the high-frequency module 10.

The inductor Lm, which preferably is a surface-mount coil component, and the resistors R1, R2, and R3, which preferably are surface-mount resistance elements, are mounted on the top surface of the multilayer body.

The switch device SWIC is driven by a driving voltage Vdd applied from the driving voltage application terminal PICVdd. The switch device SWIC connects a single common terminal PICO to one of six individual terminals PIC11 to PIC16 in accordance with the combination of control voltages Vc1, Vc2, and Vc3 respectively applied to the plurality of the control voltage application terminals PICVc1, PICVc2, and PICVc3.

The common terminal PICO is connected to an external connection port electrode PMan of the high-frequency module 10 via an antenna side matching circuit 11 that also functions as an electrostatic discharge (ESD) circuit. The port electrode PMan is connected to an external antenna ANT.

The first individual terminal PIC11 is connected to an external connection port electrode PMtL of the high-frequency module 10 through a transmission filter 12A. The port electrode PMtL is a port to which a GSM 850 transmission signal or a GSM 900 transmission signal is input from the outside. The transmission filter 12A is a filter circuit which attenuates the second and third harmonics of a GSM 850 transmission signal and a GSM 900 transmission signal and has pass bands which are the frequency bands used by a GSM 850 transmission signal and a GSM 900 transmission signal. The transmission filter 12A, which includes internal layer electrode patterns within the multilayer body, is preferably defined by a surface-mount circuit device as required.

The second individual terminal PIC12 is connected to an external connection port electrode PMtH of the high-frequency module 10 through a transmission filter 12B. The port electrode PMtH is a port to which a GSM 1800 transmission signal or a GSM 1900 transmission signal is input from the outside. The transmission filter 12B is a filter circuit which attenuates the second and third harmonics of a GSM 1800 transmission signal and a GSM 1900 transmission signal and includes pass bands which are the frequency bands used by a GSM 1800 transmission signal and a GSM 1900 transmission signal. The transmission filter 12B, which includes internal layer electrode patterns within the multilayer body, is preferably defined by a surface-mount circuit device as required.

The third individual terminal PIC13 is connected to the common terminal of a diplexer DIP. A matching inductor L2 is connected between a transmission line connecting the third individual terminal PIC13 to the common terminal of the diplexer DIP and the ground potential. The matching inductor L2 is a surface-mount circuit device mounted on the top surface of the multilayer body.

The diplexer DIP is a surface-mount circuit device in which a SAW filter SAW1 and a SAW filter SAW2 are integrally provided within a casing and is mounted on the top surface of the multilayer body.

The SAW filter SAW1 is a filter having a pass band which is the frequency band used by a GSM 850 reception signal, and has a balanced-unbalanced transforming function. The other end of the SAW filter SAW1 includes balanced terminals, which are connected to external connection port electrodes PMrL1 of the high-frequency module 10. The SAW filter SAW2 is a filter having a pass band which is the frequency band used by a GSM 900 reception signal, and has a balanced-unbalanced transforming function. The other end of the SAW filter SAW2 includes balanced terminals, which are connected to external connection port electrodes PMrL2 of the high-frequency module 10.

The fourth individual terminal PIC14 is connected to one end of a SAW filter SAW3 that defines a portion of a composite SAW filter SAWu. A matching inductor L3 is connected in series between the fourth individual terminal PIC14 and one end of the SAW filter SAW3. The matching inductor L3 is a surface-mount circuit device mounted on the top surface of the multilayer body.

The SAW filter SAW3 is a filter having a pass band which is the frequency band used by a GSM 1800 reception signal and has a balanced-unbalanced transforming function. The other end of the SAW filter SAW3 includes balanced terminals, which are connected to external connection port electrodes PMrH1 of the high-frequency module 10.

The fifth individual terminal PIC15 is connected to one end of a SAW filter SAW4 that defines a portion of the composite SAW filter SAWu. A matching inductor L4 is connected in series between the fifth individual terminal PIC15 and one end of the SAW filter SAW4. The matching inductor L4 preferably is a surface-mount circuit device mounted on the top surface of the multilayer body.

The SAW filter SAW4 is a filter having a pass band which is the frequency band used by a GSM 1900 reception signal and has a balanced-unbalanced transforming function. The other end of the SAW filter SAW4 includes balanced terminals, which are connected to external connection port electrodes PMrH2 of the high-frequency module 10.

The sixth individual terminal PIC16 is connected to a duplexer DUP. Between the sixth individual terminal PIC16 and the common terminal of the duplexer DUP, a matching inductor L5 is connected between a transmission line connecting the sixth individual terminal PIC16 to the common terminal of the duplexer DUP and the ground potential. The matching inductor L5 preferably is a surface-mount circuit device mounted on the top surface of the multilayer body.

The duplexer DUP includes a SAW filter SAWut1 and a SAW filter SAWur1, which are integrally provided within a casing. The duplexer DUP is a surface-mount circuit device and is mounted on the top surface of the multilayer body.

The SAW filter SAWut1 has a pass band which is the frequency band used by a transmission signal in a CDMA communication system, and the frequency band used by a reception signal in the system is set within the attenuation band of the filter. The transmission signal input terminal of the SAW filter SAWut1 is connected to an external connection port electrode PMct1 of the high-frequency module 10. The port electrode PMct1 is a port to which the transmission signal of a CDMA communication system is input from the outside.

The SAW filter SAWur1 has a pass band which is the frequency band used by a reception signal in a CDMA communication system, and the frequency band used by a transmission signal in the system is set within the attenuation band of the filter. The reception signal output terminal of the SAW filter SAWur1 is connected to an external connection port electrode PMcr1 of the high-frequency module 10. The port electrode PMcr1 is a port from which the reception signal of a CDMA communication system is output to the outside.

Figure 2:
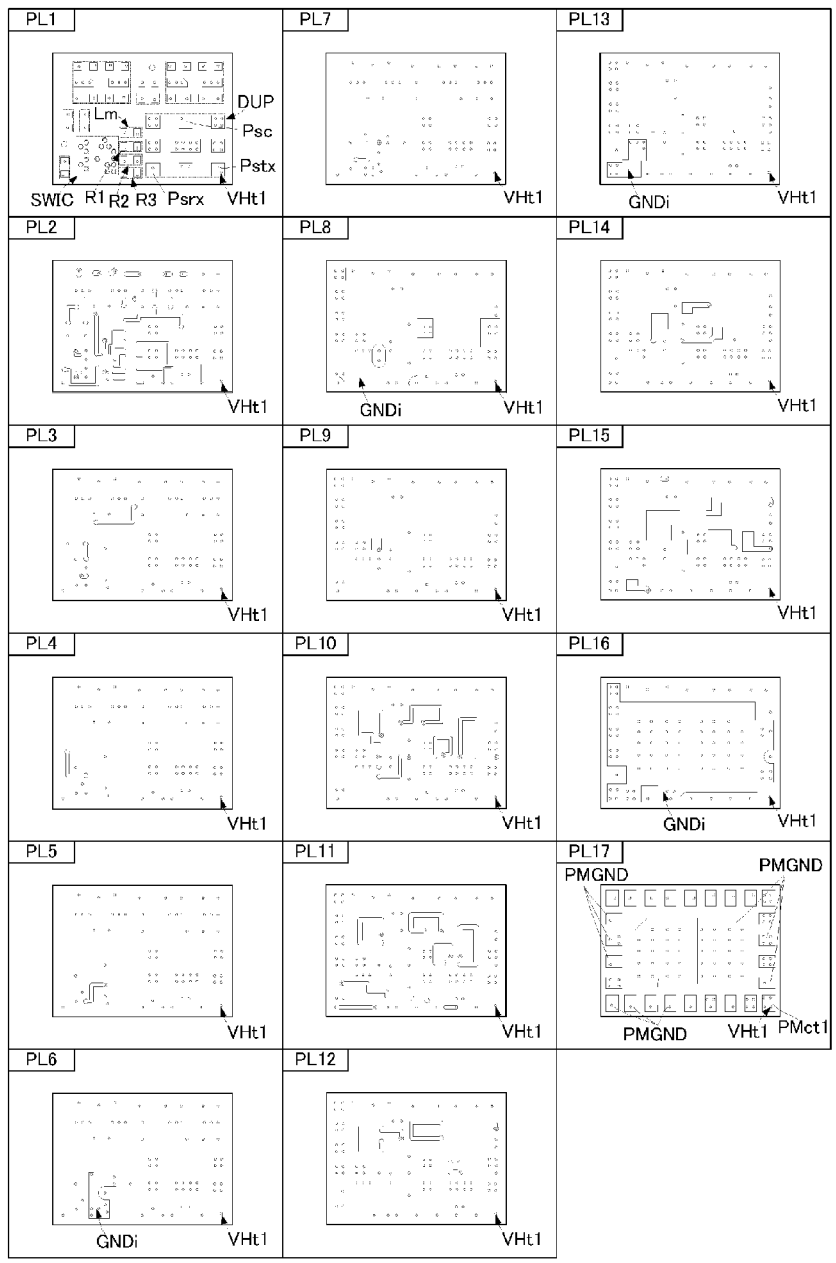
FIG. 2 is a stacking diagram of the high-frequency module of the first preferred embodiment of the present invention.
Figure 3A:
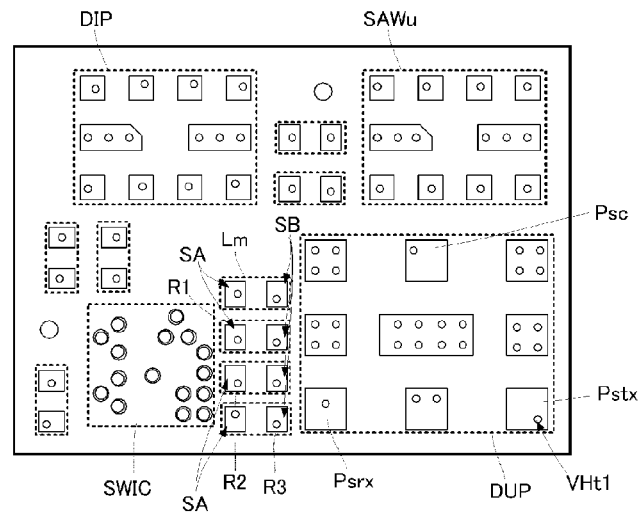
FIGS. 3A and 3B include a mounting diagram of the uppermost layer of a multilayer body of the high-frequency module according to the first preferred embodiment of the present invention, and an arrangement pattern diagram of external connection port electrodes of the lowermost layer.
Figure 3B:
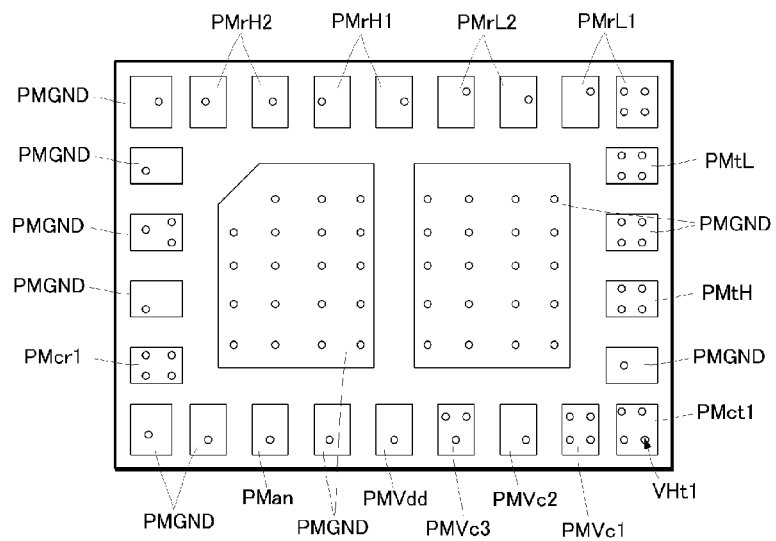

The structure of the high-frequency module 10 having the above-described circuit configuration will now be described. FIG. 2 is a stacking diagram of the high-frequency module 10 of the present preferred embodiment. FIG. 3A is a mounting diagram of the uppermost layer of the multilayer body of the high-frequency module 10 of the present preferred embodiment, and FIG. 3B is an arrangement pattern diagram of external connection port electrodes of the lowermost layer of the multilayer body. Note that in the diagrams of FIGS. 2, 3A, and 3B, small-diameter circles illustrated in the diagrams represent via holes with via conductors extending through a plurality of dielectric layers in the stacking direction.

As illustrated in FIG. 2 and FIG. 3A, the high-frequency module 10 includes a multilayer body and circuit devices described below mounted on the top surface of the multilayer body.

The multilayer body preferably has a configuration in which a predetermined number of dielectric layers are stacked on top of one another and internal layer electrodes are provided so as to define electrode patterns of the high-frequency module 10 except for circuit devices. The high-frequency module 10 of the present preferred embodiment preferably includes 17 stacked layers, however the number of the stacked layers may be appropriately set in accordance with the specifications.

The circuit devices mounted on the top surface of the multilayer body preferably include the switch device SWIC, the diplexer DIP, the duplexer DUP, the composite SAW filter SAWu, the inductors, L2, L3, L4, L5, and Lm, the resistors R1, R2, and R3, and circuit devices defining the transmission filters 12A and 12B and the antenna side matching circuit 11, for example. Note that reference symbols for the circuit devices defining the transmission filter 12A, the transmission filter 12B, and the antenna side matching circuit 11 are omitted and the detailed descriptions thereof are omitted in the description of the configuration below.

On the top surface of the first layer, which is the uppermost layer of the multilayer body, mounting electrodes arranged to mount the above-described circuit devices are provided. The duplexer DUP, the switch device SWIC, the diplexer DIP, and the composite SAW filter SAWu are mounted on the top surface of the first layer so as to be spaced apart from one another and so as to have a positional relationship as illustrated in FIG. 3A.

The inductor Lm and the resistors R1, R2, and R3 are mounted between the duplexer DUP and the switch device SWIC. Since circuit devices connected to the transmission lines of power supply system signals, which are different from transmission signals, are arranged in this manner between the duplexer DUP and the switch device SWIC, a high-power transmission signal that has leaked from the duplexer DUP is attenuated by these circuit devices. As a result, propagation of a transmission signal that has leaked from the duplexer DUP to the switch device SWIC is significantly reduced or prevented. Thus, degradation of the switch characteristics of the switch device SWIC is prevented.

Further, the inductor Lm and the resistors R1, R2, and R3 preferably have rectangular or substantially rectangular shapes, and the two ends of each device in the longitudinal direction are configured to be external connection terminals. The inductor Lm and the resistors R1, R2, and R3 are arranged and mounted along the lateral directions thereof such that they have the same or substantially the same longitudinal direction. This direction in which the inductor Lm and the resistors R1, R2, and R3 are arranged is preferably the direction in which the side of the switch device SWIC and the side of the duplexer DUP facing each other extend. Thus, the inductor Lm and the resistors R1, R2, and R3 extend over a relatively long area between and along the sides of the switch device SWIC and the duplexer DUP at which the switch device SWIC and the duplexer DUP face each other. As a result, leakage of a transmission signal, which has leaked from the duplexer DUP, to the switch device can be more reliably reduced or prevented.

The inductor Lm and the resistors R1, R2, and R3 are preferably mounted such that their external connection terminals SB that are connected to the external connection power supply system port electrodes PMVdd, PMVc1, PMVc2, and PMVc3 of the high-frequency module 10 are disposed on the duplexer DUP side. With this configuration, external connection terminals SA of the inductor Lm and the resistors R1, R2, and R3 connected to the switch device do not face the duplexer DUP and are not in the vicinity of the duplexer DUP. As a result, a transmission signal leaking to the switch device SWIC side without passing through the inductor Lm and the resistors R1, R2, and R3 is further reduced or prevented. Consequently, leakage of a transmission signal to the switch device SWIC is further reduced or prevented.

The duplexer DUP preferably has a rectangular or substantially rectangular shape, and the transmission signal input terminal, common terminal, and reception signal output terminal of the duplexer DUP are preferably arranged near different sides of the duplexer DUP. Specifically, when the duplexer DUP in a mounted state is viewed (in plan) from the stacking direction, the transmission signal input terminal is arranged near the side of one end of the duplexer DUP in the longitudinal direction, and the reception signal output terminal is arranged near the side of the other end of the duplexer DUP in the longitudinal direction. The common terminal is arranged near the side of one end opposite the other end in the lateral direction at which the transmission signal input terminal and the reception signal output terminal are arranged.

The duplexer DUP is mounted such that the side including the reception signal output terminal arranged thereon is on the switch device SWIC side. As a result of this arrangement, the transmission signal input terminal and the common terminal are spaced apart to a greater extent from the switch device SWIC. Thus, leakage of a transmission signal to the switch device SWIC can be further reduced or prevented.

Further, by mounting the duplexer DUP such that the transmission signal input terminal is located on the side of the duplexer DUP farthest from the switch device SWIC, the transmission signal input terminal can be spaced apart to a greater extent from the switch device SWIC. Thus, leakage of a transmission signal to the switch device SWIC is further reduced or prevented.

Going back to the description of the stacking structure of the multilayer body, wiring pattern electrodes are provided on the second to fifth layers of the multilayer body. An internal layer ground electrode GNDi is provided on the sixth layer at a predetermined location. A wiring pattern electrode is provided on the seventh layer. An internal layer ground electrode GNDi is provided over substantially the entire eighth layer.

Internal layer pattern electrodes for inductors and capacitors that define the antenna side matching circuit 11 and the transmission filters 12A and 12B are provided on the 9th to 15th layers. An internal layer ground electrode GNDi is provided over substantially the entire 16th layer.

On the bottom surface of the 17th layer, which is the lowermost layer of the multilayer body, the external connection port electrodes are provided and arranged in an array. As illustrated in FIG. 3B, the external connection port electrode PMct1, which is used to input of the transmission signal, is arranged on a side of the 17th layer corresponding to a side surface at which the duplexer DUP is mounted. At this time, the port electrode PMct1 is arranged at a location which is at least partially overlapped by a mounting electrode Pstx on which the transmission signal input terminal of the duplexer DUP is mounted, when the multilayer body is viewed in plan. The port electrode PMct1 is connected to the mounting electrode Pstx only through a via electrode VHt1 that extends through the multilayer body in the stacking direction. With this configuration, the port electrode PMct1 and the mounting electrode Pstx are connected to each other with the shortest distance therebetween in the stacking direction such that undesired electromagnetic coupling and electrostatic coupling with other circuit elements are unlikely to be generated. This configuration also enables leakage of a transmission signal to the switch device SWIC side to be significantly reduced or prevented.

As described above, by using the configuration of the present preferred embodiment, undesired electromagnetic coupling and electrostatic coupling between the switch device SWIC and the duplexer DUP, which are both mounted on the top surface of the multilayer body, are significantly reduced or prevented, resulting in a high level of isolation. Thus, leakage of a high-power transmission signal input to the duplexer DUP to the switch device SWIC is significantly reduced or prevented. Further, since the circuit devices mounted between the switch device SWIC and the duplexer DUP are circuit devices that are being used to define the high-frequency module 10 and not additional components, as described above, a high level of isolation can be obtained without increasing the size or complexity of the high-frequency module 10.

Figure 4:
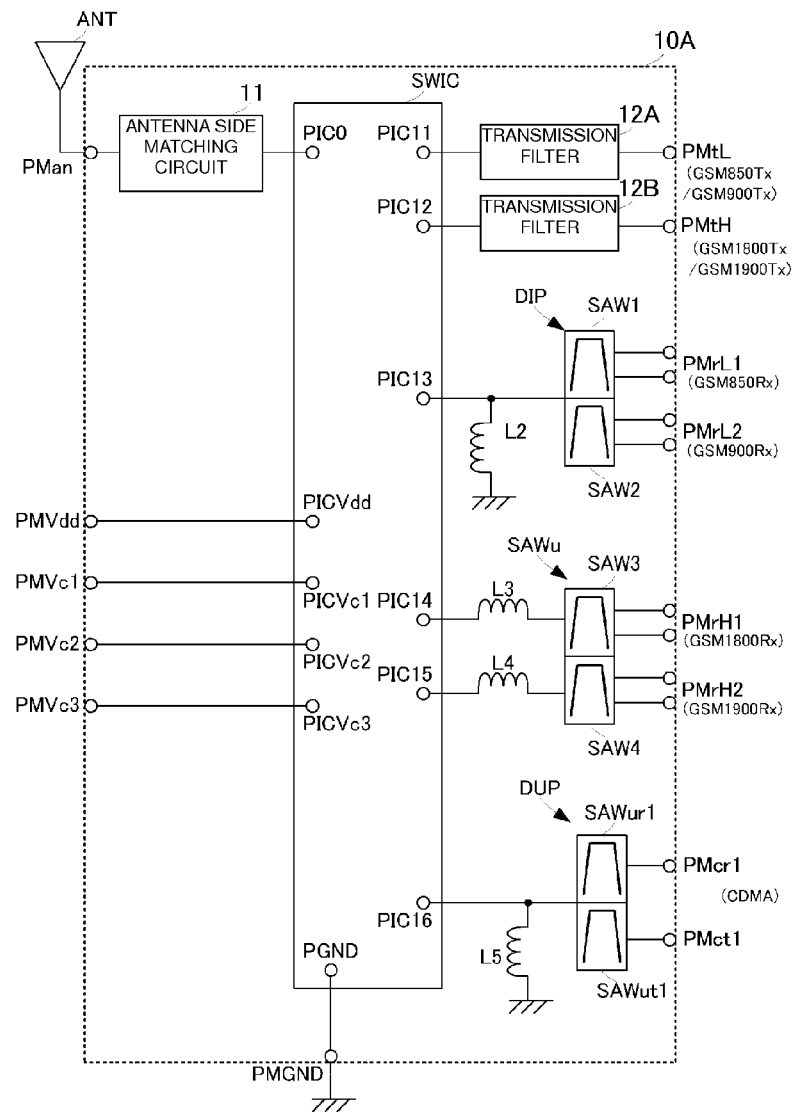
FIG. 4 is a block diagram illustrating the circuit configuration of a high-frequency module according to a second preferred embodiment of the present invention.
Figure 5:
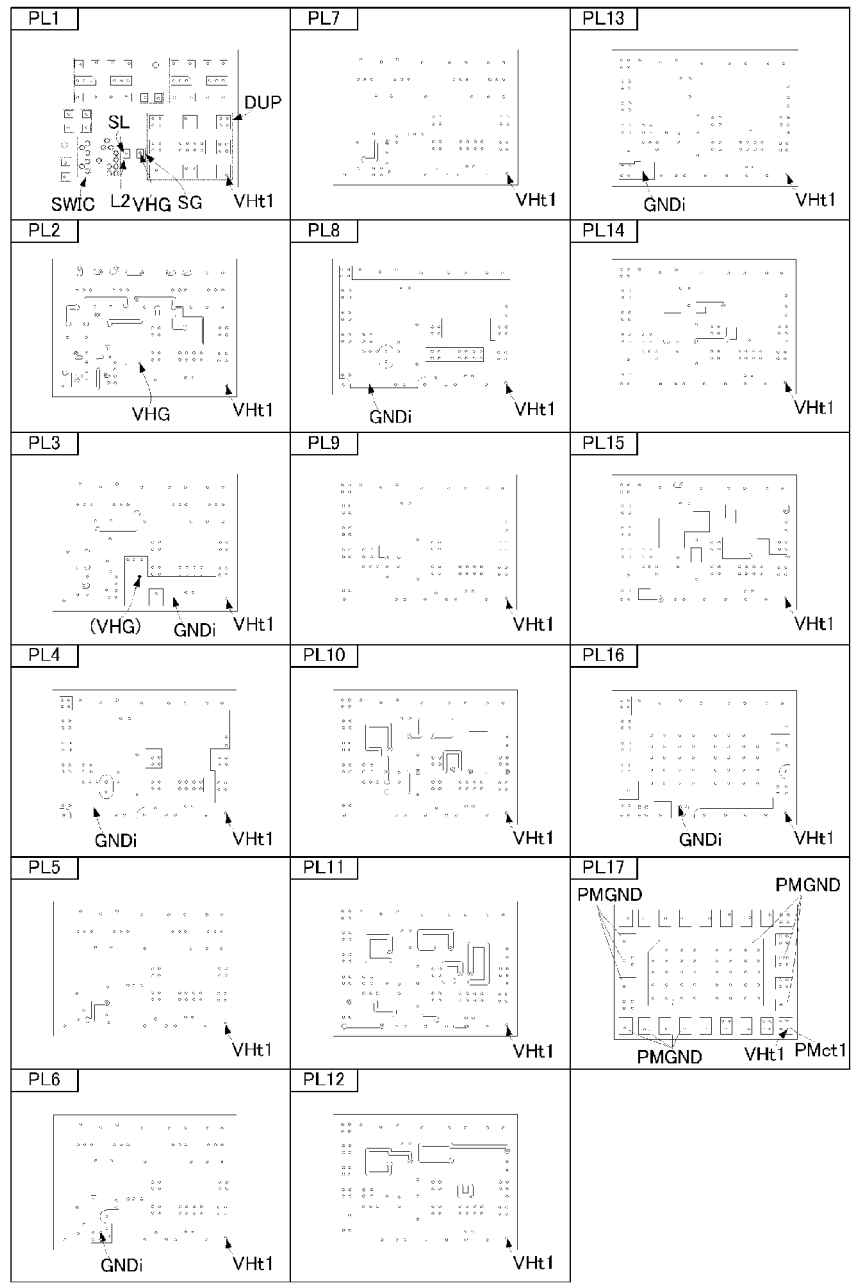
FIG. 5 is a stacking diagram of the high-frequency module of the second preferred embodiment of the present invention.
Figure 6A:
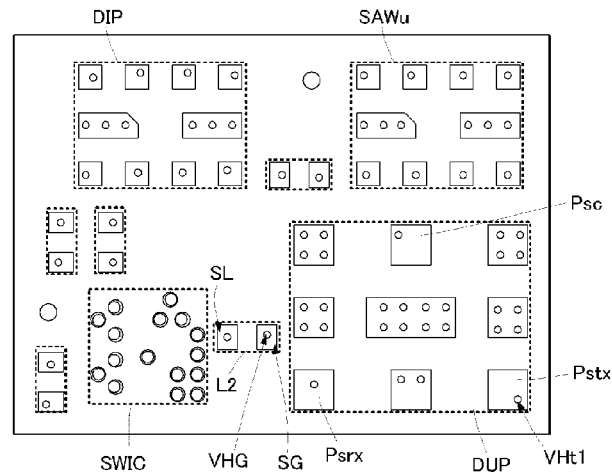
FIGS. 6A and 6B include a mounting diagram of the uppermost layer of a multilayer body of the high-frequency module according to the second preferred embodiment of the present invention, and an arrangement pattern diagram of external connection port electrodes of the lowermost layer of the multilayer body.
Figure 6B:
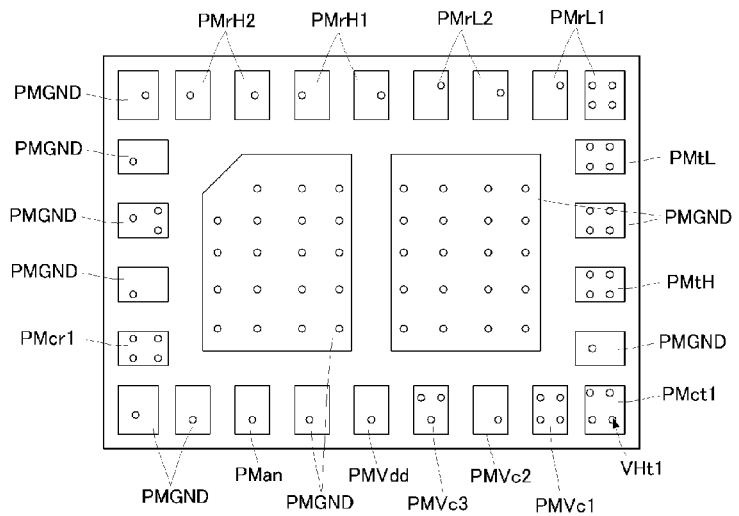

Next, a high-frequency module according to a second preferred embodiment of the present invention will be described with reference to the drawings. FIG. 4 is a block diagram illustrating the circuit configuration of a high-frequency module 10A according to the present preferred embodiment. FIG. 5 is a stacking diagram of the high-frequency module 10A of the present preferred embodiment. FIG. 6A is a mounting diagram of the uppermost layer of a multilayer body 900A of the high-frequency module 10A according to the present preferred embodiment, and FIG. 6B is an arrangement pattern diagram of external connection port electrodes of the lowermost layer of the multilayer body 900A. Note that in the diagrams of FIGS. 5, 6A, and 6B, small-diameter circles illustrated in the diagrams represent via holes with via electrodes extending through a plurality of dielectric layers in the stacking direction.

Regarding the circuit configuration of the high-frequency module 10A of the present preferred embodiment, the inductor Lm and the resistors R1, R2, and R3 are omitted, compared to the high-frequency module 10 illustrated in the first preferred embodiment, and the remainder of the configuration preferably is the same or substantially the same. Thus, only the different portions will be described and the description of the remainder of the circuit configuration will be omitted.

The driving voltage application terminal PICVdd of the switch device SWIC is directly connected to the external connection power supply system port electrode PMVdd of the high-frequency module 10A. The control voltage application terminal PICVc1 of the switch device SWIC is directly connected to the external connection power system port electrode PMVc1 of the high-frequency module 10A. The control voltage application terminal PICVc2 of the switch device SWIC is directly connected to the external connection power system port electrode PMVc2 of the high-frequency module 10A. The control voltage application terminal PICVc3 of the switch device SWIC is directly connected to the external connection power system port electrode PMVc3 of the high-frequency module 10A.

The high-frequency module 10A having the circuit configuration described above has the stacking structure and the mounting configuration illustrated in FIG. 5 and FIGS. 6A and 6B. Note that only the differences from the first preferred embodiment will be specifically described in terms of the stacking structure and the mounting configuration.

On the top surface of the first layer of the multilayer body, the matching inductor L2, which is a matching device for a receiver circuit system, is mounted between the duplexer DUP and the switch device SWIC. In this manner, by arranging the matching inductor L2 between the duplexer DUP and the switch device SWIC, a transmission signal which has leaked from the duplexer DUP is attenuated and propagation of the leakage signal to the switch device SWIC is significantly reduced or prevented, similarly to the case of the inductor Lm and the resistors R1, R2, and R3 described in the first preferred embodiment.

The matching inductor L2 is mounted such that the ground-potential-side external connection terminal SG is disposed on the duplexer DUP side. With this configuration, an external connection terminal SL of the matching inductor L2 connected to the switch device SWIC does not face and is not near the duplexer DUP. As a result, a leakage transmission signal primarily flows to the ground such that leakage of a transmission signal to the switch device SWIC side is more effectively reduced or prevented. Further, a leakage transmission signal component which did not flow to the ground is attenuated by the matching inductor L2. As a result, leakage of a transmission signal to the switch device SWIC is further reduced or prevented.

On the second and third layers of the multilayer body, wiring pattern electrodes are provided. An internal layer ground GNDi is provided on a portion of the third layer. The internal layer ground electrode GNDi is electrically connected through a via electrode VHG to a mounting electrode on which the ground potential side external connection terminal SG of the matching inductor L2 is mounted. Since the ground potential side external connection terminal SG of the matching inductor L2 and the internal layer ground electrode GNDi are electrically connected to each other only through the via electrode VHG with a short distance therebetween in this manner, a leaked transmission signal is more likely to flow to the ground potential. As a result, leakage of a transmission signal to the switch device SWIC can be further reduced or prevented.

An internal layer ground electrode GNDi is provided over substantially the entire fourth layer. A wiring pattern electrode is provided on the fifth layer. An internal layer ground electrode GNDi is provided on a portion of the sixth layer. A wiring pattern electrode is provided on the seventh layer. An internal layer ground electrode GNDi is provided over substantially the entire eighth layer.

Internal layer pattern electrodes for inductors and capacitors that define the antenna side matching circuit 11 and the transmission filters 12A and 12B are provided on the 9th to 15th layers. An internal layer ground electrode GNDi is provided over substantially the entire 16th layer.

On the bottom surface of the 17th layer, which is the lowermost layer of the multilayer body, the external connection port electrodes are provided and arranged in an array. As illustrated in FIG. 6B, the external connection port electrode PMct1, which is used to input the transmission signal, is arranged on a side of 17th layer corresponding to a side in which the duplexer DUP is mounted. The port electrode PMct1 is arranged at a location which is at least partially overlapped by a mounting electrode Pstx on which the transmission signal input terminal of the duplexer DUP is mounted, when the multilayer body is viewed in plan. The port electrode PMct1 is connected to the mounting electrode Pstx only through a via electrode VHt1 that extends through the multilayer body in the stacking direction. With this configuration, the port electrode PMct1 and the mounting electrode Pstx are connected to each other with the shortest distance therebetween in the stacking direction such that undesired electromagnetic coupling and electrostatic coupling with other circuit elements are unlikely to be generated. This configuration can also significantly reduce or prevent leakage of a transmission signal to the switch device SWIC side.

In this manner, with the configuration of the present preferred embodiment, leakage of a high-power transmission signal, input to the duplexer DUP, to the switch device is significantly reduced or prevented, similarly to the first preferred embodiment, while reducing the size of the high-frequency module.

Figure 7:
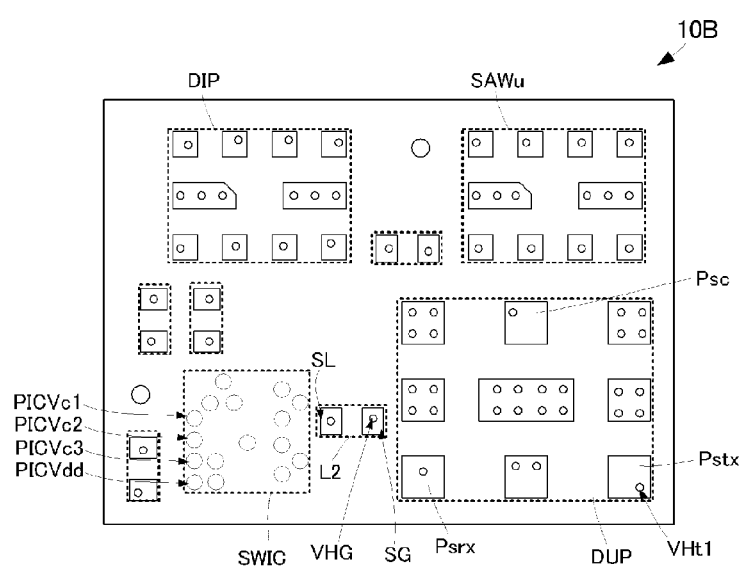
FIG. 7 is a mounting diagram of the uppermost layer of a multilayer body of a high-frequency module according to a third preferred embodiment of the present invention.

Next, a high-frequency module 10B according to a third preferred embodiment of the present invention will be described with reference to the drawings. FIG. 7 is a mounting diagram of the uppermost layer of the multilayer body of the high-frequency module 10B of the present preferred embodiment. The high-frequency module 10B of the present preferred embodiment preferably has the same or substantially the same circuit configuration as the high-frequency module 10A of the second preferred embodiment, however the manner in which the switch device SWIC is mounted on the multilayer body in the present preferred embodiment is different from that of the second preferred embodiment.

Specifically, as described above, the switch device SWIC includes the driving voltage application terminal PICVdd and the plurality of the control voltage application terminals PICVc1, PICVc2, and PICVc3, which are arranged along and near a side of the switch device SWIC, when viewed in plan.

The switch device SWIC is mounted on the multilayer body such that the driving voltage application terminal PICVdd and the control voltage application terminals PICVc1, PICVc2, and PICVc3 are arranged on the side of the switch device SWIC farthest from the duplexer DUP.

With this configuration, since the driving voltage application terminal PICVdd and the plurality of the control voltage application terminals PICVc1, PICVc2, and PICVc3 are spaced far apart from the duplexer DUP, a leaked transmission signal is unlikely to be input to these terminals. As a result, superposition of the transmission signal on the control voltage or the driving voltage and input of the transmission signal to the switch device SWIC is significantly reduced or prevented. Thus, degradation of the switch characteristics of the switch device SWIC is significantly reduced or prevented.

Note that, in the above-described preferred embodiments of the present invention, although examples have been illustrated in which the port electrodes and the mounting electrodes to be connected are preferably connected to one another using only via electrodes, wiring using predetermined inner layer electrodes may be used within a range about the size of a mounting area corresponding to each SAW filter in plan view. Also with this configuration, isolation between a transmission system circuit and a reception system circuit for the same communication signal can be maintained at a high level.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a switch device arranged to selectively connect a common terminal to a plurality of individual terminals;
   a duplexer arranged to separate a transmission signal and a reception signal in a single communication band;
   a multilayer body including the switch device and the duplexer mounted on a top surface of the multilayer body, external connection port electrodes provided on a bottom surface of the multilayer body, and predetermined electrode patterns defining the high-frequency module provided on internal layers of the multilayer body; and
   a surface-mount circuit device mounted on the top surface of the multilayer body; wherein
   the surface-mount circuit device is connected at a location different from a transmission path for the transmission signal and is mounted on the multilayer body between the switch device and the duplexer;
   the switch device includes a plurality of power supply system terminals to which a driving voltage and a control voltage are applied;
   the external connection port electrodes include a plurality of power supply system input port electrodes to which the driving voltage and the control voltage are applied;
   the circuit device which is mounted between the switch device and the duplexer includes at least one resistance element and/or at least one coil component connected between the plurality of the power supply system terminals and the plurality of the power supply system input port electrodes; and
   the at least one resistance element and/or the at least one coil component is mounted on the multilayer body such that an end of the at least one resistance element and/or the at least one coil component connected to at least one of the plurality of power supply system input port electrodes is disposed closer to the duplexer than to the switch device.

2. The high-frequency module according to claim 1, wherein the duplexer has a quadrangular or substantially quadrangular shape when viewed in plan from a stacking direction of the internal layers of the multilayer body;
a transmission signal input terminal, a common terminal, and a reception signal output terminal are provided on the multilayer body adjacent to sides of the duplexer; and
the duplexer is mounted on the multilayer body such that a side of the duplexer that is different from the sides of the duplexer adjacent to which the transmission signal input terminal and the common terminal are provided is arranged on a switch device side of the multilayer body.

3. The high-frequency module according to claim 2, wherein the duplexer is mounted on the multilayer body such that the side adjacent to which the transmission signal input terminal is provided is a side farthest from the switch device.

4. The high-frequency module according to claim 1, wherein
the external connection port electrodes include a transmission signal input electrode to which the transmission signal is input from outside the high-frequency module; and
the duplexer is mounted on the multilayer body such that the transmission signal input terminal and the transmission signal input port electrode are at least partially superposed with each other when the multilayer body is viewed in plan.

5. The high-frequency module according to claim 4, wherein an electrode on which the transmission signal input terminal is mounted is connected to the transmission signal input port electrode only by a via electrode provided in the stacking direction of the internal layers of the multilayer body.

6. The high-frequency module according to claim 1, wherein the circuit device mounted between the switch device and the duplexer is a matching device connected to a transmission path different from a reception signal transmission path including the duplexer.

7. The high-frequency module according to claim 6, wherein one end of the matching device is connected to ground, and the matching device is mounted on the multilayer body such that the one end is on the duplexer side of the multilayer body.

8. The high-frequency module according to claim 1, wherein the duplexer is mounted on the multilayer body on a side of the switch device opposite a side of the switch device where the power supply system terminals are arranged.

9. The high-frequency module according to claim 1, further comprising a diplexer mounted on the top surface of the multilayer body and connected between at least one of the plurality of individual terminals and the switch device.

10. The high-frequency module according to claim 9, wherein the diplexer includes at least two surface acoustic wave filters that are integrally provided in a casing.

11. The high-frequency module according to claim 1, wherein the duplexer includes at least two surface acoustic wave filters that are integrally provided in a casing.

12. The high-frequency module according to claim 1, further comprising a composite surface acoustic wave filter mounted on the top surface of the multilayer body and connected between at least one of the plurality of individual terminals and the switch device.

13. The high-frequency module according to claim 1, wherein the at least one resistance element and/or the at least one coil component has a rectangular or substantially rectangular shape.

14. The high-frequency module according to claim 1, wherein the at least one resistance element and/or the at least one coil component includes a plurality of resistance elements and at least one coil component.

15. The high-frequency module according to claim 14, wherein
each of the plurality of resistance elements and the at least one coil component has a rectangular or substantially rectangular shape having a longitudinal dimension and a width dimension that is less than the longitudinal dimension; and
the plurality of resistance elements and the at least one coil component are arranged on the top surface of the multilayer body such that the longitudinal dimension of each of the plurality of resistance elements and the at least one coil component extends in the same direction.

16. The high-frequency module according to claim 14, wherein
each of the plurality of resistance elements and the at least one coil component includes an external connection terminal connected to a respective one of the plurality of power supply system input port electrodes; and
the external connection terminal of each of the plurality of resistance elements and the at least one coil component disposed on a duplexer side of the multilayer body.

17. The high-frequency module according to claim 1, wherein the predetermined electrode patterns on the internal layers of the multilayer body define at least one inductor and/or at least one capacitor.

18. The high-frequency module according to claim 1, further comprising a ground electrode disposed over substantially an entire surface of a lowermost one of the internal layers of the multilayer body.

* * * * *